United States Patent
Lebrun et al.

(10) Patent No.: US 9,853,181 B2
(45) Date of Patent: Dec. 26, 2017

(54) METHOD FOR PREPARING A RECRYSTALLISED SILICON SUBSTRATE WITH LARGE CRYSTALLITES

(71) Applicant: COMMISSARIAT À L'ENERGIE ATOMIQUE ET AUX ENERGIES ALTERNATIVES, Paris (FR)

(72) Inventors: Jean-Marie Lebrun, Saint Martin D'Heres (FR); Jean-Paul Garandet, Le Bourget du Lac (FR); Jean-Michel Missiaen, Saint Martin D'Heres (FR); Céline Pascal, Saint Martin D'Uriage (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/025,498

(22) PCT Filed: Sep. 24, 2014

(86) PCT No.: PCT/IB2014/064796
§ 371 (c)(1),
(2) Date: Mar. 28, 2016

(87) PCT Pub. No.: WO2015/044875
PCT Pub. Date: Apr. 2, 2015

(65) Prior Publication Data
US 2016/0211404 A1 Jul. 21, 2016

(30) Foreign Application Priority Data

Sep. 27, 2013 (FR) .................................. 13 59341

(51) Int. Cl.
*H01L 21/02* (2006.01)
*H01L 31/068* (2012.01)
(Continued)

(52) U.S. Cl.
CPC ............ *H01L 31/1872* (2013.01); *C30B 1/02* (2013.01); *C30B 28/02* (2013.01); *C30B 29/06* (2013.01);
(Continued)

(58) Field of Classification Search
CPC ............ H01L 31/036; H01L 31/03682; H01L 21/02667
See application file for complete search history.

(56) References Cited

U.S. PATENT DOCUMENTS

| 5,304,357 A * | 4/1994 | Sato ................. H01L 21/67121 117/39 |
| 6,566,683 B1 * | 5/2003 | Ogawa ............... B23K 26/0732 257/53 |

(Continued)

FOREIGN PATENT DOCUMENTS

| CN | 103137781 A | 6/2013 |
| WO | 2004/093202 A1 | 10/2004 |
| WO | 2012/049300 A1 | 4/2012 |

OTHER PUBLICATIONS

Dec. 2, 2016 Office Action issued in Chinese Patent Application No. 201480053567.3.
(Continued)

*Primary Examiner* — Thanh V Pham
(74) *Attorney, Agent, or Firm* — Oliff PLC

(57) ABSTRACT

A method for preparing silicon substrate having average crystallite size greater than or equal to 20 μm, including at least the steps of: (i) providing polycrystalline silicon substrate of which average grain size is less than or equal to 10 μm; (ii) subjecting substrate to overall homogeneous plastic deformation, at temperature of at least 1000° C.; (iii) subjecting substrate to localized plastic deformation in plurality of areas of substrate, called external stress areas, spacing between two consecutive areas being at least 20 μm, local
(Continued)

Figure 1:
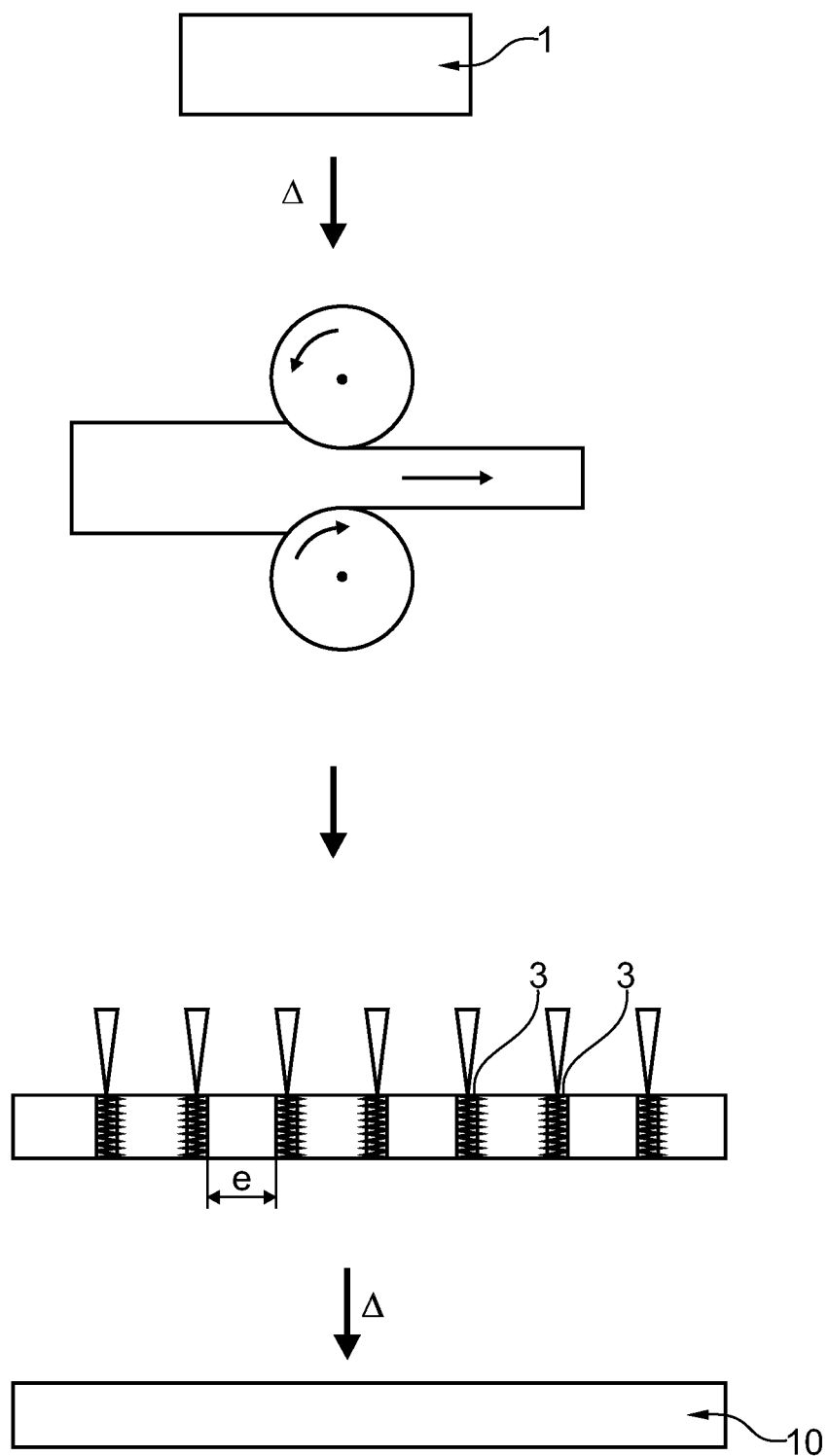

deformation of substrate being strictly greater than overall deformation carried out in step (ii); step (iii) being able to be carried out subsequent to or simultaneous to step (ii); and (iv) subjecting substrate obtained in step (iii) to recrystallization heat treatment in solid phase, at temperature strictly greater than temperature used in step (ii), in order to obtain desired substrate.

20 Claims, 2 Drawing Sheets

(51) Int. Cl.
    H01L 31/18      (2006.01)
    C30B 1/02       (2006.01)
    C30B 29/06      (2006.01)
    C30B 33/02      (2006.01)
    C30B 28/02      (2006.01)
    H01L 31/0368    (2006.01)

(52) U.S. Cl.
    CPC ........ *C30B 33/02* (2013.01); *H01L 31/03682* (2013.01); *H01L 31/068* (2013.01); *H01L 31/182* (2013.01); *H01L 21/02532* (2013.01); *H01L 21/02595* (2013.01); *H01L 21/02667* (2013.01); *Y02E 10/50* (2013.01); *Y02P 70/521* (2015.11)

(56) References Cited

U.S. PATENT DOCUMENTS

2007/0178675 A1  8/2007  Straboni
2014/0154402 A1  6/2014  Lebrun et al.

OTHER PUBLICATIONS

Lebrun, Jean-Marie et al., "The Role of Silica Layer on Sintering Kinetics of Silicon Powder Compact", Journal of the American Ceramic Society, Jan. 16, 2012, vol. 95, No. 5, pp. 1514-1523.
Reber, Stefan et al., "Crystalline Silicon Thin-Film Solar Cells—Recent Results at Fraunhofer ISE", Solar Energy, Dec. 1, 2004, vol. 77, No. 6, pp. 865-875.
Schins, W. J. H. et al., "Deformation and recrystallization of polycrystalline silicon", Journal of Materials Science, Nov. 1, 1981, vol. 16, No. 11, pp. 3153-3160.
Jan. 27, 2015 Search Report issued in International Patent Application No. PCT/IB2014/064796.
Lall, C. et al., "Recrystallization of Polycrystalline Silicon", Materials Science and Engineering, Mar. 1, 1981, vol. 47, No. 3, pp. 265-270.
Kinoshita, M. et al., "Recrystallization of Cast Polycrystalline Silicon", Materials Science and Engineering, Jan. 1, 1981, vol. 47, No. 1, pp. 29-35.
Mar. 29, 2016 International Preliminary Report on Patentability issued in International Patent Application No. PCT/IB2014/064796.

* cited by examiner

METHOD FOR PREPARING A RECRYSTALLISED SILICON SUBSTRATE WITH LARGE CRYSTALLITES

The present invention relates to a novel process for preparing a silicon substrate having an average crystallite size of 20 μm or more from a polysilicon substrate having too small grains to be used directly in photovoltaic applications.

Silicon crystallized into crystallites of size larger than 20 μm is indeed of particular interest for its semiconductor properties in the context of production of photovoltaic cells.

At the present time, photovoltaic cells are mainly manufactured from multicrystalline or single-crystal silicon. The commonest approach to producing crystalline silicon involves directional solidification of ingots from a liquid silicon bath. These ingots are then cut into wafers that may be converted into photovoltaic cells. Unfortunately, the sawing of the ingots leads to a loss of silicon ("kerf loss") of about 50%. For obvious reasons, this sawing-related loss of material is detrimental to production yields.

As alternatives to the manufacture of wafers by sawing of ingots, techniques have been developed with a view to directly producing silicon in the form of wafers or ribbons of thickness typically varying between 100 and 500 μm (edge-defined film-fed growth, ribbon against drop and ribbon growth on substrate). However, these methods are not completely satisfactory, especially with regard to the problems of cost and/or process control that they raise.

Another way of overcoming the problem of loss of silicon is to implement liquid or vapor phase epitaxy (LPE or VPE) techniques. These techniques allow, by growth on a substrate, layers of a few tens of microns in thickness and of good crystal quality to be obtained with a moderate cost and high growth rates (typically from 0.1 to 5 μm/min).

Unfortunately, conventional epitaxy methods require expensive single-crystal substrates to be used if layers of sufficient quality are to be obtained.

However, if cost is to be decreased, it is essential to find a way to replace single-crystal silicon substrates with substrates of polycrystalline silicon, i.e. what are referred to as "low-cost" substrates.

To produce such substrates of polycrystalline silicon, two techniques, based on sintering of silicon powders, have recently been proposed. The first is based on hot pressing of a powder bed in a mould [1]; the second is based on thermal sintering without pressing, i.e. what is called natural sintering [2]. However, to permit effective sintering the starting crystallites must be submicron-sized, and the maturation during the process does not allow grains of size larger than 2 μm to be obtained, even after several hours at 1350° C. [3]. Sizes as small as this are prohibitive for the implementation of these substrates in photovoltaic applications.

To rectify this fault and obtain substrates having a larger grain size compatible with a photovoltaic use, various liquid-phase grain recrystallization processes have been proposed. For example, Reber et al. [4] propose what is called a ZMR (zone melting recrystallization) process consisting in heating the surface of a sintered wafer with infrared lamps or by laser radiation, in order to superficially melt the silicon over a thickness of about 10 to 20 μm, the liquid silicon then recrystallizing into millimeter-sized grains on cooling. However, the ZMR technique poses problems of throughput and contamination because of the very high temperatures required to melt the silicon.

Regarding solid-phase recrystallization processes, a technique using the association of a hot deformation step and a recrystallization heat treatment is known in the field of metallurgy. This technique has been implemented in the case of silicon [5], in which it has allowed crystallites of size compatible with photovoltaic applications to be obtained. However, a very long time, longer than about ten hours, is required to recrystallize the silicon, even if the recrystallization heat treatment is carried out at a high temperature of about 1300° C. Such rates are incompatible with the production yield requirements of the photovoltaic industry.

Therefore, there remains a need to provide an inexpensive high-productivity method for producing a large-crystallite polycrystalline silicon substrate suitable for the epitaxy of thin silicon layers for a photovoltaic use.

The present invention aims precisely to meet this need.

It thus relates, according to a first of its aspects, to a process for preparing a silicon substrate having an average crystallite size larger than or equal to 20 μm, comprising at least the steps consisting in:

(i) providing a polycrystalline silicon substrate the average grain size of which is lower or equal to 10 μm;

(ii) subjecting said substrate to an overall and uniform plastic deformation at a temperature of at least 1000° C.;

(iii) subjecting said substrate to a plastic deformation localized in a plurality of substrate zones (3) referred to as zones of external stress, the spacing e between two consecutive zones (3) being at least 20 μm, the local deformation being strictly greater than the overall deformation carried out in step (ii), step (iii) possibly being carried out consecutively to or at the same time as step (ii); and (iv) subjecting the substrate obtained at the end of step (iii) to a solid-phase recrystallization heat treatment, at a temperature strictly higher than the temperature implemented in step (ii), in order to obtain said expected substrate.

The inventors have discovered that surprisingly it is possible, by associating a step (ii) of hot overall plastic deformation and a step (iii) of localized deformation, to obtain the desired large-crystallite substrate with a recrystallization treatment of reduced duration. In contrast, each of the two plastic deformation steps (ii) and (iii) considered in isolation does not, alone, allow the desired recrystallization to be achieved at a rate compatible with photovoltaic applications.

In the rest of the text, the silicon substrate obtained at the end of step (iv) of the process of the invention will be more simply designated the "recrystallized substrate".

According to another of its aspects, the present invention relates to a silicon substrate having an average crystallite size of 20 μm or more and capable of being obtained by the process defined above.

Such a recrystallized substrate according to the present invention especially has, on at least one of its sides, a succession of recesses spaced apart from one another by a distance (d), in a vertical cross-sectional plane, larger than or equal to 20 μm, the depth of a recess, measured in a direction parallel to the thickness of the substrate, being at least 5 μm and in particular 20 to 100 μm.

According to yet another of its aspects, the present invention relates to a photovoltaic device, in particular a photovoltaic cell, including a silicon substrate such as defined above.

Figure 2:
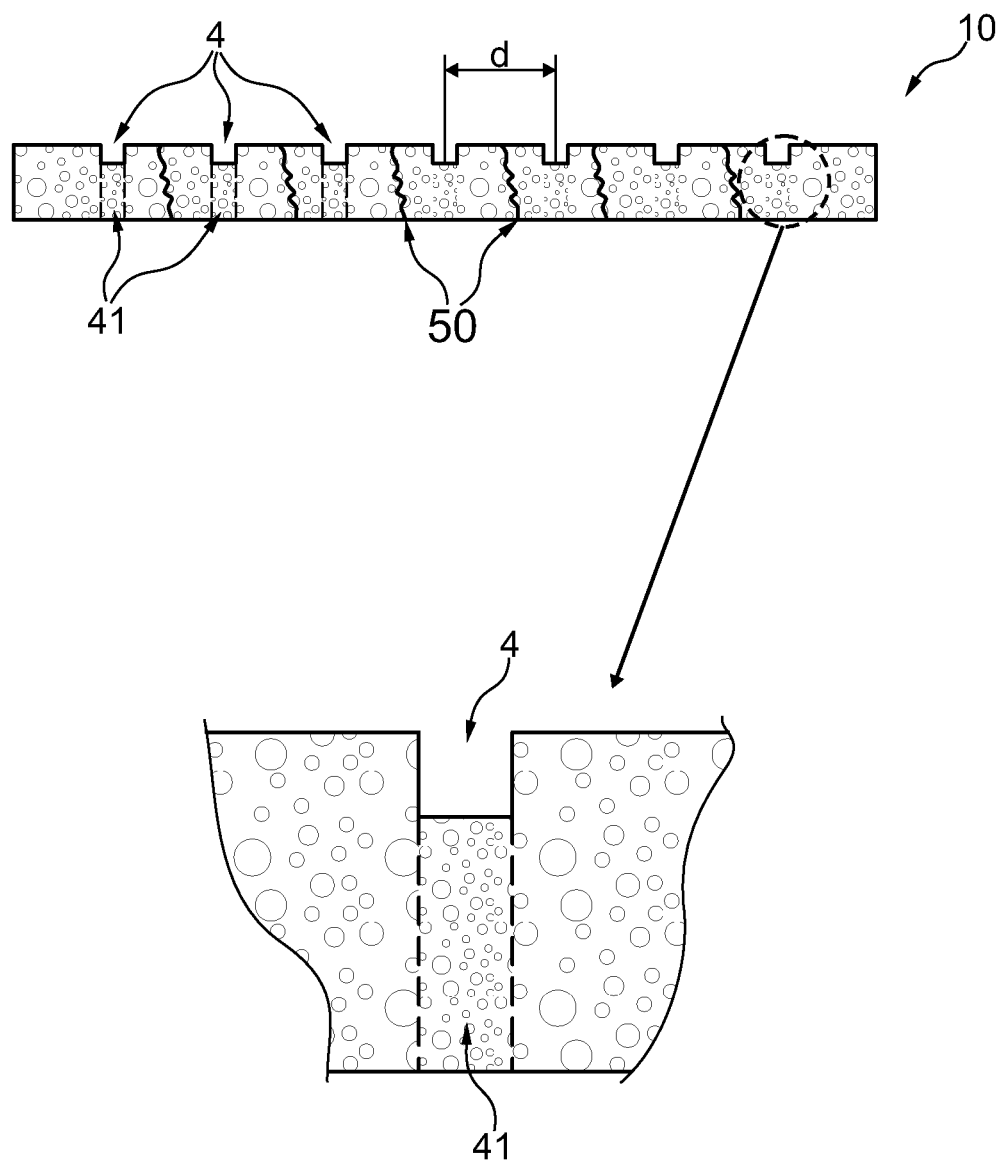

Other features, advantages and methods of applying the process and recrystallized silicon substrate according to the invention will become more apparent on reading the following detailed description of exemplary embodiments and on examining the appended drawings, in which:

FIG. 1 schematically shows in cross section the various steps of the process for preparing a recrystallized silicon substrate according to the invention, according to one particular embodiment illustrated in example 1; and FIG. 2 schematically shows in cross section the structure of the recrystallized silicon substrate at the end of step (iv) of the process of the invention (recrystallized substrate (10) shown in its entirety, and magnification of the structure of the substrate level with a recess (4)).

It should be noted that for the sake of clarity, the various elements in FIGS. 1 and 2 are not shown to scale, the actual dimensions of the various portions not being respected.

In the rest of the text, the expressions "comprised between . . . and . . . ", "ranging from . . . to . . . " and "varying from . . . to . . . " are equivalent and are understood to mean that the end values are included, unless stated otherwise.

Unless otherwise indicated, the expressions "including/comprising a" and "defining a" must be understood as "including/comprising at least one" and "defining at least one".

Step (i): Polycrystalline Silicon Substrate

As mentioned above, the process of the invention implements a polycrystalline silicon substrate having an average grain size of 10 µm or less, designated the "starting substrate" in the rest of the text.

In the context of the present invention, the term "substrate" refers to a solid basic structure having at least two substantially parallel sides. The substrate implemented in the process of the invention may more particularly take the form of a wafer. It may especially be the shape of a cuboid, of square or rectangular base.

In the rest of the text, and unless otherwise indicated, the wafer type substrate is characterized when it is observed in its horizontal position (i.e. in a direction normal to the direction of Earth's gravity i.e. in the direction referred to as the vertical direction).

Preferably, the dimensions of the starting substrate are chosen so that the recrystallized substrate obtained at the end of the process of the invention has the desired dimensions, in particular dimensions suitable for photovoltaic applications.

The starting substrate implemented in step (i) of the process of the invention may for example have, in a vertical cross-sectional plane, a width comprised between 5 and 25 cm. The length of the starting substrate may be larger than or equal to its width and in particular comprised between 1 times and 5 times its width.

It may have a thickness larger than or equal to 100 µm, in particular comprised between 100 and 1000 µm and more particularly comprised between 200 and 500 µm.

According to one particular embodiment, the starting silicon substrate has an average grain size of 5 µm or less, and in particular comprised between 0.1 and 2 µm.

The average grain size may be determined by scanning electron microscopy (SEM) and image analysis, the latter allowing the area of the observed grains to be determined, the average grain size then corresponding to the square root of such an area.

Such a silicon substrate may for example be produced, prior to its implementation in step (i) of the process of the invention, by sintering, especially from a powder of silicon particles or a preform obtained by compacting a powder of silicon particles.

It is generally known in the art how to adapt the sintering technique and the conditions of the sintering, for example in terms of the particle size of the silicon powder used, to obtain the desired polycrystalline silicon starting substrate.

The sintering may for example be carried out with or without loading, the loading consisting in applying an exterior force to the sample, during the heat treatment, in order to promote the densification thereof.

According to one particularly preferred embodiment, the starting substrate is produced by a natural sintering technique, in other words without loading. Such a natural sintering technique advantageously allows loading-related contamination problems to be avoided and a substrate of good purity, compatible with photovoltaic applications, to be obtained.

By way of example, the silicon substrate implemented in step (i) of the process of the invention may be produced using the sintering technique described in document WO 2012/049300 [2], this technique advantageously allowing a substrate of controlled density and porosity to be obtained.

The starting substrate may for example have a porosity lower than or equal to 40% and in particular comprised between 0 and 20%. The porosity may be measured using the Archimedes density method.

Step (ii): Overall and Uniform Plastic Deformation

In a second step (ii) of the process of the invention, the starting substrate is subjected to an overall and uniform first plastic deformation step, carried out hot.

The expression "subject the substrate to a deformation" is understood to designate the fact that an external stress is applied at least to one portion of the substrate, so that the distance between two points of said substrate is reversibly and/or irreversibly modified. The external stress conventionally consists in applying a movement, for example by contact of at least one side of the substrate with a suitable device, for example a roller, a traction bench or a compression bench. It may even be applied by exposing the substrate to be deformed to radiation, for example laser radiation.

The deformation of the silicon substrate, resulting from a deformation step, includes a reversible deformation component, called the elastic component, and an irreversible deformation component, called the plastic component. In the case of the deformations generated in the substrate according to the process of the invention, since the elastic component is very small or even negligible relative to the plastic component, the deformations applied according to the process of the invention may be considered to be plastic deformations.

The term "overall" is understood to mean the fact that the plastic deformation in step (ii) is produced in at least 95% of the volume of the substrate, in particular at least 99% of the volume of the substrate.

The term "uniform" is understood to designate the fact that the plastic deformation of the substrate produced in step (ii) is substantially constant in the volume of the deformed substrate.

In other words, a step of deformation of the substrate that may be termed a step of "overall and uniform" deformation is such that analytical or numerical modeling, for example carried out using the software package CASTEM, of the mechanical behavior of the substrate during said deformation step results in a uniform deformation field.

The overall deformation step (ii) may more particularly be carried out using an external stress consisting in applying movements to at least one side of the substrate and preferably to at least 80%, in particular at least 90%, or even the entirety of the area of said side of the substrate.

Such an overall deformation of the substrate may for example be produced by a rolling operation, as more particularly detailed in the rest of the text: the thickness of the starting silicon substrate is then decreased, its width (measured in a direction parallel to the axis of rotation of the rolling rolls) preserved and its length increased.

The uniformity of the deformation of the substrate at the end of step (ii) of the process of the invention may for example be verified via a local measurement of the deformations, for example by way of measurement, using a laser technique, of variations in the geometric dimensions of the sample, or using a measurement of the atomic-plane displacement fields measured by X-ray diffraction. X-ray topography techniques and laser techniques for measuring the variations in the geometric dimensions of a sample are known in the art.

The step (ii) of overall plastic deformation of the substrate according to the process of the invention is carried out hot, at a temperature of at least 1000° C.

Preferably, it is carried out at a temperature of 1200° C. or less, and in particular a temperature comprised between 1100 and 1200° C., and more particularly of about 1150° C. More particularly, the expression "step carried out at a temperature X" is understood to mean a step carried out in an oven the operating temperature of which is set to a setpoint value X.

In the field of metal forming, those skilled in the art know how to implement techniques suitable for inducing an overall and uniform deformation of a substrate.

The step (ii) of deformation of the substrate may for example be carried out by simple compression, channel die compression, biaxial compression, simple traction, biaxial traction, simple shear or by rolling. Among these techniques, rolling, because of its implementational simplicity, is particularly preferred.

According to one particularly preferred embodiment, step (ii) according to the invention is thus carried out by hot rolling.

As schematically shown in FIG. 1, the rolling may be carried out by completely introducing the substrate (1) of step (i) between the two rolling rolls of a roller, in order to decrease the thickness of the substrate. One pass of the substrate between the rolling rolls constitutes a deformation step, called a "rolling pass". The step (ii) of overall deformation may include only one or several rolling passes. In the case where a plurality of rolling passes are carried out, the total plastic deformation applied is calculated from the thickness of the starting substrate (1) before the first rolling pass, and its thickness after the last rolling pass.

Preferably, the hot rolling is implemented using rolling rolls made of silicon nitride ($Si_3N_4$) or of silicon carbide (SiC). Since silicon carbide contains fewer impurities, rolls made of silicon carbide are preferably used. The risk of the silicon substrate being polluted on contact with the surface of the rolling rolls is thus advantageously limited.

The substrate obtained at the end of step (ii) of the invention is designated, in the rest of the text, the "overall deformed substrate".

This overall deformed substrate contains crystal defects, especially dislocations and twins, distributed substantially uniformly in the volume of the substrate when observed at an observation scale larger than 1 mm.

According to one particular embodiment, the overall deformed substrate at the end of step (ii) of the process of the invention has a uniform plastic deformation comprised between 1 and 20%, in particular between 5 and 10% and more particularly between 5 and 9%.

The degree of plastic deformation may be estimated using methods known to those skilled in the art by taking into consideration the experimental conditions of implementation of the deformation, for example via the measurement of the movements imposed on the side or sides of the substrate.

Conventionally, the deformation may be measured by the quantity $\epsilon^P = 1 - h/h_0$ where $h_0$ is the initial thickness of the substrate in step (i) before deformation and h the thickness of the overall deformed substrate at the end of step (ii) of the process of the invention.

The dimensions $h_0$ and h may be measured by conventional methods, for example using a laser measurement method.

The overall deformation of the substrate at the end of step (ii) may be considered to be uniform when the following condition (A) is met:

$$\sqrt{\frac{1}{n-1} \sum_{i=1}^{n} (\varepsilon_i^p - \varepsilon^{-p})^2} \leq 0.1 \, \varepsilon^{-p} \quad (A)$$

where:
$\epsilon_i^p$ represents the plastic deformation, measured locally, for example by laser, in one portion of the substrate referred to as a measurement zone i. The measurement zones may be selected at random or be regularly distributed over the surface of the overall deformed substrate. The area of each of said measurement zones may be comprised between 1 $\mu m^2$ and 50 $\mu m^2$, or even between 2 $\mu m^2$ and 20 $\mu m^2$.

n corresponds to the number of measurement zones in which the measurement is carried out, preferably n≥5, or even n≥10; and $$-\varepsilon^{-p} = \frac{\sum_{i=1}^{n} \varepsilon_i^p}{n}$$

is the arithmetic mean of the deformations measured in the n measurement zones of the substrate.

Step (iii): Localized Plastic Deformation

In a third step (iii) of the process of the invention, as shown in FIG. 1, the substrate is subjected to a second plastic deformation. In contrast to the step (ii) of overall and uniform plastic deformation, this deformation step (iii) is localized to a plurality of preset zones (3) of the substrate, which zones are referred to as "zones of external stress" in the rest of the text.

When a step of plastic deformation is said to be "localized", what is meant is that an external stress is applied to a number of defined zones (3) of the surface of the substrate, which zones are located on at least one of the sides of the substrate, and affects mainly the portion of the substrate located beneath said zones (3), in contrast to what is referred to as a "overall" deformation that affects the entirety of the substrate. The total area of the zones (3) of external stress on the surface of one of the sides of the substrate in particular represents less than 10% of the area of said side.

In other words, analytical or numerical modeling, for example using the software program CASTEM (applying the finite element method), of the mechanical behavior of the substrate during said step (iii) of localized deformation, results in a nonuniform deformation field in the volume of the substrate, i.e. a field containing deformation gradients.

In other words, the uniformity criterion (A) defined above for the overall and uniform deformation is in no case met for the deformed substrate obtained at the end of step (iii).

In the case where the external stress corresponds to the application of movements by contact, the zone (3) of external stress is defined by the area of the side of the substrate on which the movements are imposed. In the case where the external stress corresponds to the interaction of radiation, for example laser radiation, with the silicon, the zone of external stress corresponds to the area defined by the intersection of the beam emitted by the radiation source with the side of the substrate that it meets.

According to one of the features of the step (iii) of localized deformation of the process of the invention, the spacing (e), measured in a vertical cross-sectional plane, between two consecutive zones (3) of external stress is at least 20 μm.

Preferably, two consecutive zones (3) are spaced apart by a distance e larger than or equal to 80 μm, in particular larger than or equal to 100 μm, especially larger than or equal to 150 μm, and preferably comprised between 200 and 2000 μm.

According to one particularly preferred embodiment, the deformation step (iii) is localized to zones (3) that are regularly spaced over one of the sides of the substrate. In other words, the distance (e) between two consecutive zones (3) is substantially identical for all the zones (3) of the substrate.

Depending on the means of application of the external stress, the zones (3) may be different shapes and for example be the shape of a square, a disk, an ellipse, a strip, etc.

Preferably, the zones (3) are the shape of strips or stripes that extend, parallel to one another, from one edge of the substrate to the other over its length or width. These strips or stripes may especially have a width, in a vertical cross-sectional plane, smaller than 100 μm and in particular comprised between 2 and 50 μm.

The step (iii) of localized deformation may be carried out at various temperatures, especially depending on the means of implementation of the deformation (compression, shear, laser radiation, etc.).

According to a first particularly preferred variant embodiment, the step (iii) of localized deformation is carried out at a temperature higher than or equal to 1000° C., and especially comprised between 1100° C. and 1200° C.

According to one particular embodiment, it may be carried out at an identical temperature to that implemented in the step (ii) of overall deformation.

According to a second variant embodiment, the step (iii) of localized deformation is carried out at a temperature strictly below 1000° C. and in particular comprised between 400 and 800° C. and more particularly between 500 and 800° C.

A step of localized deformation carried out cold advantageously allows a higher density of crystal defects, especially dislocations, to be generated relative to a step of localized deformation carried out hot. The residual elastic energy produced by a high dislocation density is thus increased, thereby advantageously promoting, during the recrystallization of the substrate in step (iv), accelerated recrystallization and a narrow crystallite size dispersion in the final substrate.

According to a first embodiment, the step (iii) of localized deformation may be carried out by means of one or more compression operations, for example uniaxial compression operations, and/or one or more shear operations in which a shear stress is applied to the surface of said zones (3), for example using one or more tips.

A compression operation may consist in compressing the preset zone (3) with said one or more tips, so that the tip(s) locally modify the relief of the side of the substrate irreversibly. In particular, the substrate zone that was compressed has, at the end of the compression operation, a shape substantially complementary to the shape of the tip used to apply the compression. When no shear operation is carried out consecutively to or at the same time as a compression operation, the tip is moved so as to be freed from the substrate without being translated over the locally deformed substrate.

A shear operation more particularly consists in placing said one or more tips in contact with said zone (3), then in moving said one or more tips in at least one direction parallel to one of the sides of the substrate, so as to introduce a shear deformation.

According to one particularly preferred embodiment, the step (iii) of localized deformation is carried out using a comb. A comb is formed of a plurality of rigid tips that are connected together by way of a holder and regularly spaced apart from one another by a distance (e') equal to the distance (e) between two consecutive zones (3).

The application of a localized plastic deformation using a comb thus allows, in the substrate, a nonuniform deformation field having the desired spatial periodicity, the period of which is defined by the spacing between the tips of the comb, to be created.

The comb may include at least two, preferably at least five and in particular at least ten tips.

Preferably, the tips are made of a material harder than silicon, in other words a material the Vickers hardness of which is higher than or equal to 250 MPa or equivalently 25.5 Hv, for example of silicon nitride or silicon carbide, and preferably of silicon carbide.

According to a first particular embodiment, the deformation step (iii) is carried out via at least one step of compression of the surface of said zones (3) using the comb. This compression step may consist in uniaxially compressing the surface using the comb.

The preferably vertical compression movement, denoted u, imposed on the comb so that the tips of the comb compress the surface of the substrate from their position of contact with the zones (3), may more particularly be larger than or equal to 5 μm and in particular comprised between 20 and 100 μm.

The comb may even be translated in order to introduce a maximum of shear favorable to the formation of dislocations.

Thus, according to a second particular embodiment, the deformation step (iii) is carried out via at least one operation of translating the comb over the surface of the zones (3), so as to introduce a shear deformation.

Of course, the two aforementioned particular embodiments may be combined, the step (iii) of localized deformation possibly comprising both a compression operation and a shear operation.

Those skilled in the art will be able to adapt the conditions of implementation of the steps of compression and/or translation of the comb so as to obtain the desired local deformation.

According to another variant embodiment of the invention, the step (iii) of localized plastic deformation may be carried out by exposing said zones (3) of external stress to radiation, in particular laser radiation. Such a laser treatment is conventionally referred to as laser shot peening.

The laser radiation preferably has one or more wavelengths longer than or equal to 100 nm and especially ranging from 400 to 5000 nm.

Preferably, the laser treatment is carried out with a laser of small spot size, for example from 1 to 20 μm and preferably from 2 to 5 μm.

A plurality of laser radiation emission sources may be implemented, for example so as to form a comb of beams that are spaced apart regularly from one another in order to simultaneously irradiate the various zones (3). Alternatively, step (iii) may be carried out by exposing each of the zones (3) to the laser radiation in succession.

As mentioned above, the local deformation of the substrate produced in step (iii) of the process of the invention is strictly larger than the overall and uniform deformation carried out in step (ii).

It will be understood that the expression "local plastic deformation of the substrate" means plastic deformation of the portions of the substrate located beneath said zones (3) of external stress.

According to one particular embodiment, the local plastic deformation of the substrate (equivalent plastic deformation $\epsilon^p$), at the end of step (iii) of the process of the invention, is strictly larger than 20%, in particular comprised between 30 and 60%, and more particularly about 50%.

This plastic deformation corresponds to the maximum substrate deformation value beneath the zone of external stress. This value represents the level of deformation undergone by the substrate between its initial state and that obtained at the end of all of the applied deformations (the deformations sum).

According to one variant embodiment of the process of the invention, the steps of overall deformation (ii) and of localized deformation (iii) are carried out at the same time on the substrate of step (i). They then define a step (ii') called a conjoint deformation step.

This conjoint deformation step (ii') may be carried out by passing the substrate between the two rolls of a roller, having a general cylinder of revolution shape, at least one of the two rolls comprising bosses extending radially toward the exterior relative to the rolling axis of the rolling roll.

The bosses may for example take the form of hemispherical sections, of teeth, of ribs placed parallel to the axis of the roll, of annular collars protruding radially from the roll, etc. Of course, the spacing between two bosses is chosen appropriately for the application of movements to the localized zones (3) of the substrate.

Preferably, step (ii') is carried out using a toothed roller roll.

Step (iv): Recrystallization

In a step (iv) of the process of the invention, the locally and overall deformed substrate obtained at the end of step (iii) is subjected to a solid-phase recrystallization heat treatment, also referred to as a thermal anneal, so as to obtain the desired recrystallized substrate.

This recrystallization heat treatment is propitious to the germination of crystallites preferentially in the locally deformed substrate portions located beneath the zones (3) of external stress, and to their growth in the rest of the volume of the overall deformed substrate, in place of the deformed grains.

This recrystallization heat treatment may be carried out by any annealing technique known to those skilled in the art and conventionally implemented in the production of photovoltaic cells, in an in-line oven for example.

The recrystallization heat treatment is carried out at a temperature strictly above the temperature implemented for the deformation in step (ii). Preferably, it is carried out at a temperature at least 50° C. above the temperature implemented in step (ii) and in particular at least 100° C. or even at least 150° C. above the temperature implemented in step (ii).

Those skilled in the art will know how to adapt the conditions of the thermal anneal, especially in terms of duration and temperature, to obtain the desired recrystallized substrate.

In particular, the heat treatment in step (iv) may be carried out at a temperature of 1200° C. or more, and in particular at a temperature comprised between 1250 and 1400° C. and more particularly of about 1350° C.

According to one particular embodiment, this heat treatment step is carried out for a length of time of 5 hours or less and in particular for a length of time comprised between 30 minutes and 2 hours.

At the end of step (iv) of the process of the invention, the recrystallized substrate may especially have a degree of recrystallization higher than 80%, especially higher than 90%, in particular higher than 99% or even substantially equal to 100%.

The degree of recrystallization of the substrate may be evaluated by the electron backscatter diffraction (EBSD) technique, for example using a scanning electron microscope (SEM).

According to one particular embodiment, in the case where the deformation steps (ii) and (iii) are both carried out hot, steps (ii), (iii) and/or (iv) may advantageously be carried out in an in-line oven, thus promoting high production rates.

Recrystallised Substrate

As mentioned above, the present invention also relates, according to another of its aspects, to the substrate, called a "recrystallized substrate", capable of being obtained by the process described above.

According to one particular embodiment, as illustrated in FIG. 2, the recrystallized substrate (10) comprises, on at least one of its sides, a succession of recesses (4) that are spaced apart from one another by a distance (d), in a vertical cross-sectional plane, larger than or equal to 20 μm, the depth of a recess, measured in a direction parallel to the thickness of the substrate, being at least 5 μm.

Said recesses (4) may more particularly have a depth, measured in a direction parallel to the thickness of the substrate, comprised between 20 and 100 μm.

Preferably, the recesses (4) are regularly spaced apart from one another; in other words, the distance (d) between two consecutive recesses is substantially the same for all the recesses.

These recesses correspond to the residual substrate deformations related to the step (iii) of localized deformation of the process according to the invention.

The recesses may for example correspond to the superficial marks produced in the substrate by the tips of a comb employed in step (iii) to compress the surface of the substrate.

The recesses in a recrystallized substrate according to the invention may especially take the form of grooves extending from one edge of the substrate to the other, over its length or its width.

Preferably, two consecutive recesses (4) are spaced apart by a distance (d), in a vertical cross-sectional plane, larger than or equal to 80 μm, in particular of at least 100 μm, preferably of at least 150 μm and more preferably comprised between 200 and 2000 μm.

As illustrated in FIG. 2 the porosity referred to as the "residual porosity" of those portions of the substrate (41) which are located beneath the recesses (i.e. which are located below the recesses in a direction normal to the side containing said recesses) is strictly lower than the porosity of the rest of the substrate (10).

These porosity variations are observable visually, for example from SEM micrographs.

This feature may advantageously be used to distinguish a recrystallized substrate according to the invention from substrates that would not be obtained by a process according to the invention.

A substrate recrystallized according to the process of the invention may more particularly exhibit, in a vertical cross-sectional plane and between two recesses, localized grain boundaries (50) passing through its thickness, in particular substantially equidistant from two consecutive recesses (4).

According to one particular embodiment, each crystallite of the substrate recrystallized according to the process of the invention extends right through the thickness of the substrate, as shown in FIG. 2.

The recrystallized substrate according to the invention has a crystallite size larger than or equal to 20 µm. In particular, the crystallite size may be comprised between 50 and 2000 µm and especially between 100 and 300 µm. The average size of the grains may be measured by the electron backscatter diffraction (EBSD) technique using a scanning electron microscope (SEM).

Preferably, the ratio of the average crystallite size of the recrystallized substrate at the end of step (iv) to the average grain size of the starting substrate of step (i) is comprised between 2 and 10000, in particular comprised between 5 and 2500 and more particularly comprised between 50 and 1000.

As mentioned above, the recrystallized substrate according to the invention is particularly well suited to its implementation as a base substrate for the formation by epitaxy of thin silicon films for a photovoltaic application.

Thus, according to another of its aspects, the present invention relates to a photovoltaic device, in particular a photovoltaic cell, comprising a recrystallized silicon substrate such as described above.

It is of course generally known in the art how to implement suitable conventional treatments (deposition of thin films by epitaxy, formation of one or more metallizations, etc.) to produce a photovoltaic cell from a silicon substrate (10) according to the invention.

The invention will now be described by means of the following example that is, of course, given by way of nonlimiting illustration of the invention.

EXAMPLE (i) Starting Substrate

The substrate used is a silicon wafer having sides of 1 cm² and a thickness of 400 µm. It is obtained beforehand by sintering a powder of silicon particles at 1350° C. for 3 hours, according to the natural sintering technique described in document WO 2012/049300 [2].

The silicon wafer has a porosity, measured by Archimedes density, of about 14%, and a grain size, measured by scanning electron microscopy (SEM), comprised between 0.2 and 1 µm and an average grain size of 0.6 µm.

(ii) Overall Plastic Deformation

The wafer is subjected to an overall deformation by hot rolling at 1150° C. by passage between two silicon carbide rolls.

The plastic deformation, evaluated by laser measurement of the geometric dimensions of the part before and after deformation, is about 7%.

The deformation is measured using the following convention:
$\epsilon^P = 1 - h/h_0$ where $h_0$ is the initial thickness of the substrate and h is the thickness of the deformed substrate.

(iii) Localized Plastic Deformation

The wafer is then subjected to a localized deformation by moving a silicon carbide comb over zones of the side of the substrate, which zones are spaced apart by about 250 µm, at a temperature of 1150° C.

The deformation of the locally deformed portions of the substrate (portions located beneath recesses produced by the tips of the comb during the localized deformation operation), evaluated by a local laser measurement, is about 40%.

(iv) Recrystallization Heat Treatment

The deformed wafer is then heat treated at 1350° C. for 3 hours, and entirely recrystallized.

The complete recrystallization of the silicon is confirmed by an EBSD (diffraction pattern of backscattered electrons) of the wafer, before and after recrystallization.

Result

The germination of the crystallites and their growth from the 40% deformed portions of the substrate is observed. The average size of the crystallites formed around the deformed zones, measured by scanning electron microscopy (SEM), is 215 µm.

REFERENCES

[1] WO 2004/093202;
[2] WO 2012/049300;
[3] Lebrun et al., J. Am. Ceramic. Soc., 1-9 (2012), DOI: 10.1111/j.1551-2916.2011.05052.x.;
[4] Reber et al., Crystalline silicon thin film solar cells—recent results at Fraunhoffer ISE, Solar Energy, 77 (2004) 865-875;
[5] Schins et al.; J. Materials Science, 16 (1981), 3153-3160.

The invention claimed is:

1. A process for preparing a silicon substrate having an average crystallite size larger than or equal to 20 µm, comprising at least the steps consisting in:
(i) providing a polycrystalline silicon substrate the average grain size of which is lower or equal to 10 µm;
(ii) subjecting said substrate to an overall and uniform plastic deformation at a temperature of at least 1000° C.;
(iii) subjecting said substrate to a plastic deformation localized in a plurality of substrate zones referred to as zones of external stress, the spacing between two consecutive zones being at least 20 µm, the local deformation of the substrate being strictly greater than the overall deformation carried out in step (ii), step (iii) possibly being carried out consecutively to or at the same time as step (ii); and
(iv) subjecting the substrate obtained at the end of step (iii) to a solid-phase recrystallization heat treatment, at a temperature strictly higher than the temperature implemented in step (ii), in order to obtain said expected substrate.

2. The process as claimed in claim 1, in which said substrate in step (i) has an average grain size of 5 µm or less.

3. The process as claimed in claim 1, in which step (ii) is carried out at a temperature comprised between 1100 and 1200° C.

4. The process as claimed in claim 1, in which the step (ii) of overall plastic deformation is carried out by hot rolling.

5. The process as claimed in claim 4, in which the step (ii) of overall plastic deformation is carried out using rolling rolls made of silicon carbide or silicon nitride.

6. The process as claimed in claim 1, in which the uniform plastic deformation of the substrate at the end of step (ii) is comprised between 1 and 20%.

7. The process as claimed in claim 1, in which the spacing between two consecutive zones is larger than or equal to 80 μm.

8. The process as claimed in claim 1, in which the spacing between two consecutive zones is comprised between 200 μm and 2000 μm.

9. The process as claimed in claim 1, in which the step (iii) of localized plastic deformation is carried out using a comb the tips of which are made of a material of Vickers hardness higher than or equal to 250 MPa.

10. The process as claimed in claim 9, in which the tips of the comb are made of silicon carbide or silicon nitride.

11. The process as claimed in claim 9, in which step (iii) is carried out via at least one step of compression of the surface of said zones using the comb.

12. The process as claimed in claim 9, in which step (iii) is carried out via at least one operation of translating the comb over the surface of said zones, so as to introduce a shear deformation.

13. The process as claimed in claim 1, in which the step (iii) of localized plastic deformation is carried out by exposing said zones to laser radiation.

14. The process as claimed in claim 13, which the step (iii) of localized plastic deformation is carried out by exposing said zones at one or more wavelengths longer than or equal to 100 nm.

15. The process as claimed in claim 1, in which step (iii) is carried out at a temperature strictly below 1000° C.

16. The process as claimed in claim 1, in which step (iii) is carried out at a temperature higher than or equal to 1000° C.

17. The process as claimed in claim 16, in which the step (iii) of localized deformation is carried out at the same time as the step (ii) of overall deformation.

18. The process as claimed in claim 1, in which the local plastic deformation of the substrate at the end of step (iii) is strictly larger than 20%.

19. The process as claimed in claim 1, in which the recrystallization heat treatment in step (iv) is carried out at a temperature at least 50° C. above the temperature implemented in step (ii).

20. The process as claimed in claim 1, in which the recrystallization heat treatment in step (iv) is carried out at a temperature at least 100° C. above the temperature implemented in step (ii).

* * * * *